(12) United States Patent
Chang et al.

(10) Patent No.: US 8,941,403 B2
(45) Date of Patent: Jan. 27, 2015

(54) SEMICONDUCTOR DEVICE AND METHOD OF TESTING THE SAME

(75) Inventors: Jinman Chang, Suwon-si (KR); Kyounghyun Kim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 218 days.

(21) Appl. No.: 13/524,434

(22) Filed: Jun. 15, 2012

(65) Prior Publication Data

US 2012/0326743 A1   Dec. 27, 2012

(30) Foreign Application Priority Data

Jun. 22, 2011 (KR) .................. 10-2011-0060784

(51) Int. Cl.
*G01R 1/067* (2006.01)
*G01R 31/00* (2006.01)
*G01R 31/28* (2006.01)

(52) U.S. Cl.
CPC .................................. *G01R 31/2884* (2013.01)
USPC .................................................... 324/755.01

(58) Field of Classification Search
CPC ............... G01R 31/00; G01R 31/2884; G01R 31/318511
See application file for complete search history.

(56) References Cited

U.S. PATENT DOCUMENTS

| 6,534,924 | B1* | 3/2003 | Oguchi et al. ............. 315/169.1 |
| 6,911,814 | B2 | 6/2005 | Miller et al. |
| 7,479,793 | B2 | 1/2009 | Park et al. |
| 2004/0036491 | A1* | 2/2004 | Hirao ............................ 324/754 |
| 2008/0277661 | A1* | 11/2008 | Machida et al. ................ 257/48 |
| 2009/0008641 | A1* | 1/2009 | Michimata et al. ............. 257/48 |
| 2009/0065947 | A1* | 3/2009 | Kudou .......................... 257/774 |
| 2010/0201395 | A1* | 8/2010 | Ukai ............................. 324/765 |

FOREIGN PATENT DOCUMENTS

| JP | 2007524837 | 8/2007 |
| KR | 1020020087303 | 11/2002 |
| KR | 1020070077696 | 7/2007 |

* cited by examiner

*Primary Examiner* — Melissa Koval
*Assistant Examiner* — Courtney McDonnough
(74) *Attorney, Agent, or Firm* — F. Chau & Associates, LLC

(57) ABSTRACT

A semiconductor device includes a unit region including a circuit test region and a probe test region. The circuit test region includes a test circuit and a plurality of circuit test pads operatively coupled to the test circuit. The probe test region includes first and second probe test pads insulated from the circuit test pads, and a first resistance pattern operatively coupled to the first and second probe test pads.

10 Claims, 10 Drawing Sheets

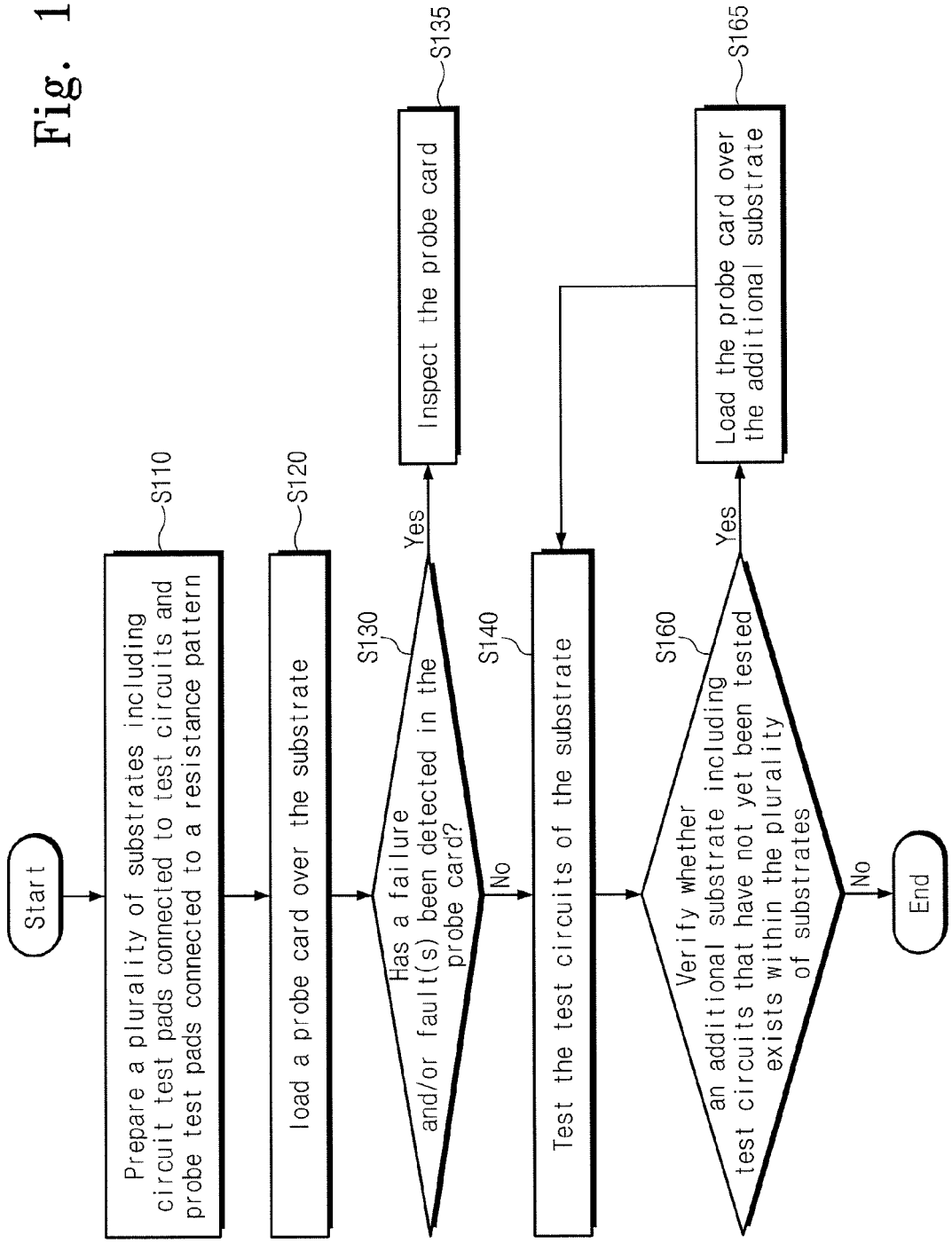

SEMICONDUCTOR DEVICE AND METHOD OF TESTING THE SAME

CROSS-REFERENCE TO RELATED APPLICATIONS

This application claims priority under 35 U.S.C. §119 to Korean Patent Application No. 10-2011-0060784, filed on Jun. 22, 2011, the disclosure of which is incorporated by reference herein in its entirety.

TECHNICAL FIELD

Exemplary embodiments of the present inventive concept relate to a semiconductor device and a method of testing the same.

DISCUSSION OF THE RELATED ART

Semiconductor devices are frequently used in the electronic industry due to their small size and low manufacturing cost. The reliability and integration level of semiconductor devices may influence their performance. As a result, semiconductor devices having high reliability and a high integration level, and methods of efficiently testing the reliability of semiconductor devices, have been increasingly demanded in the electronic industry.

SUMMARY

According to an exemplary embodiment of the inventive concept, a semiconductor device includes a substrate including a unit region including a plurality of main chips, a circuit test region, and a probe test region. A test circuit and circuit test pads are disposed on the circuit test region, and the circuit test pads are connected to the test circuit. A first probe test pad, a second probe test pad, and a first resistance pattern are disposed on the probe test region. The first and second probe test pads are insulated from the main chips and the circuit test pads, and the first resistance pattern is connected to the first and second probe test pads.

In an exemplary embodiment, the semiconductor device further includes a third probe test pad disposed on the probe test region and insulated from the main chips and the circuit test pads. A resistance value between the second and third probe test pads may be greater than a resistance value of the first resistance pattern.

In an exemplary embodiment, the semiconductor device further includes a second resistance pattern connected to the first and third probe test pads, and having the same resistance value as that of the first resistance pattern.

In an exemplary embodiment, the semiconductor device further includes fourth, fifth and sixth probe test pads disposed on the probe test region and insulated from the main chips and the circuit test pads. A third resistance pattern is disposed on the probe test region and connected to the fourth and fifth probe test pads. A fourth resistance pattern is disposed on the probe test region and connected to the fourth and sixth probe test pads.

In an exemplary embodiment, the fourth, fifth and sixth probe test pads are insulated from the first, second and third probe test pads.

In an exemplary embodiment, resistance values of the first to fourth resistance patterns are substantially equal to each other.

In an exemplary embodiment, the semiconductor device further includes third and fourth probe test pads disposed on the probe test region and insulated from the main chips, the circuit test pads, and the first and second probe test pads. A second resistance pattern is disposed on the probe test region and connected to the third and fourth probe test pads.

In an exemplary embodiment, resistance values of the first and second resistance patterns are substantially equal to each other.

In an exemplary embodiment, the semiconductor device further includes third to n-th probe test pads disposed on the probe test region, where n is a positive integer greater than or equal to 4. The first to n-th probe test pads may be configured to be in contact with first to n-th probe pins of a probe card.

In an exemplary embodiment, the circuit test pads include first to n-th circuit test pads, and the first to n-th circuit test pads are configured to be in contact with the first to n-th probe pins of the probe card.

According to an exemplary embodiment of the inventive concept, a method of testing a semiconductor device includes preparing a substrate including main chips, test circuits, circuit test pads connected to the test circuits, first and second probe test pads insulated from the main chips and the circuit test pads, and a first resistance pattern connected to the first and second probe test pads, bringing probe pins of a probe card into contact with the first and second probe test pads, and measuring a resistance value of the first resistance pattern.

In an exemplary embodiment, the measured resistance value may be within tolerance of a real resistance value of the first resistance pattern. In this case, the method may further include bringing the probe pins of the probe card into contact with the circuit test pads.

In an exemplary embodiment, the measured resistance value may be out of tolerance of a real resistance value of the first resistance pattern. In this case, the method may further include inspecting the probe card.

In an exemplary embodiment, the substrate further includes a third probe test pad insulated from the main chips and the circuit test pads, and a second resistance pattern connected to the first and third probe test pads. In this case, measuring the resistance value may further include measuring a resistance value of the second resistance pattern after measuring the resistance value of the first resistance pattern.

In an exemplary embodiment, the substrate further includes third and fourth probe test pads insulated from the main chips and the first and second probe test pads, and a second resistance pattern connected to the third and fourth probe test pads. In this case, measuring the resistance value may include measuring resistance values of the first and second resistance patterns simultaneously.

According to an exemplary embodiment of the inventive concept, a semiconductor device includes a unit region including a circuit test region and a probe test region, a test circuit and a plurality of circuit test pads disposed in the circuit test region, wherein the circuit test pads are operatively coupled to the test circuit, and a first probe test pad, a second probe test pad, and a first resistance pattern disposed in the probe test region, wherein the first and second probe test pads are insulated from the circuit test pads, and the first resistance pattern is operatively coupled to the first and second probe test pads.

According to an exemplary embodiment of the inventive concept, a method of testing a semiconductor device includes establishing contact between a plurality of probe pins of a probe card and a first probe test pad and a second probe test pad disposed in a probe test region of the semiconductor device, wherein the first and second probe test pads are operatively coupled to a first resistance pattern disposed in the probe test region, and are insulated from a plurality of circuit test pads disposed in a circuit test region of the semiconductor device, and measuring a resistance value of the first resistance pattern.

According to an exemplary embodiment of the inventive concept, a probe test region of a semiconductor device includes a first probe test group including a first probe test pad, a second probe test pad, a third probe test pad, a first resistance pattern, and a second resistance pattern, wherein the first resistance pattern is operatively coupled to the first and second probe test pads, and the second resistance pattern is operatively coupled to the first and third probe test pads, and a second probe test group including a fourth probe test pad, a fifth probe test pad, a sixth probe test pad, a third resistance pattern, and a fourth resistance pattern, wherein the third resistance pattern is operatively coupled to the fourth and fifth probe test pads, and the fourth resistance pattern is operatively coupled to the fourth and sixth probe test pads.

BRIEF DESCRIPTION OF THE DRAWINGS

The above and other features of the inventive concept will become more apparent by describing in detail exemplary embodiments thereof with reference to the accompanying drawings, in which:

FIG. 12 is a flow chart illustrating a method of testing semiconductor devices, according to exemplary embodiments of the inventive concept.

DETAILED DESCRIPTION OF THE EXEMPLARY EMBODIMENTS

Figure 1:
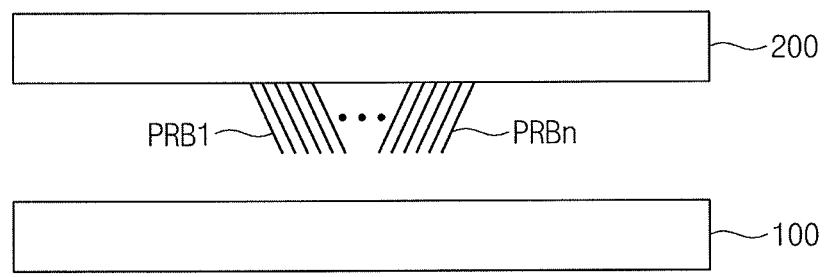
FIG. 1 is a cross-sectional view illustrating a semiconductor device, according to an exemplary embodiment of the inventive concept.

Exemplary embodiments of the inventive concept will be described more fully hereinafter with reference to the accompanying drawings. Like reference numerals may refer to like elements throughout the accompanying drawings.

The terminology used herein is for the purpose of describing particular exemplary embodiments, and is not intended to limit the inventive concept. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 2:
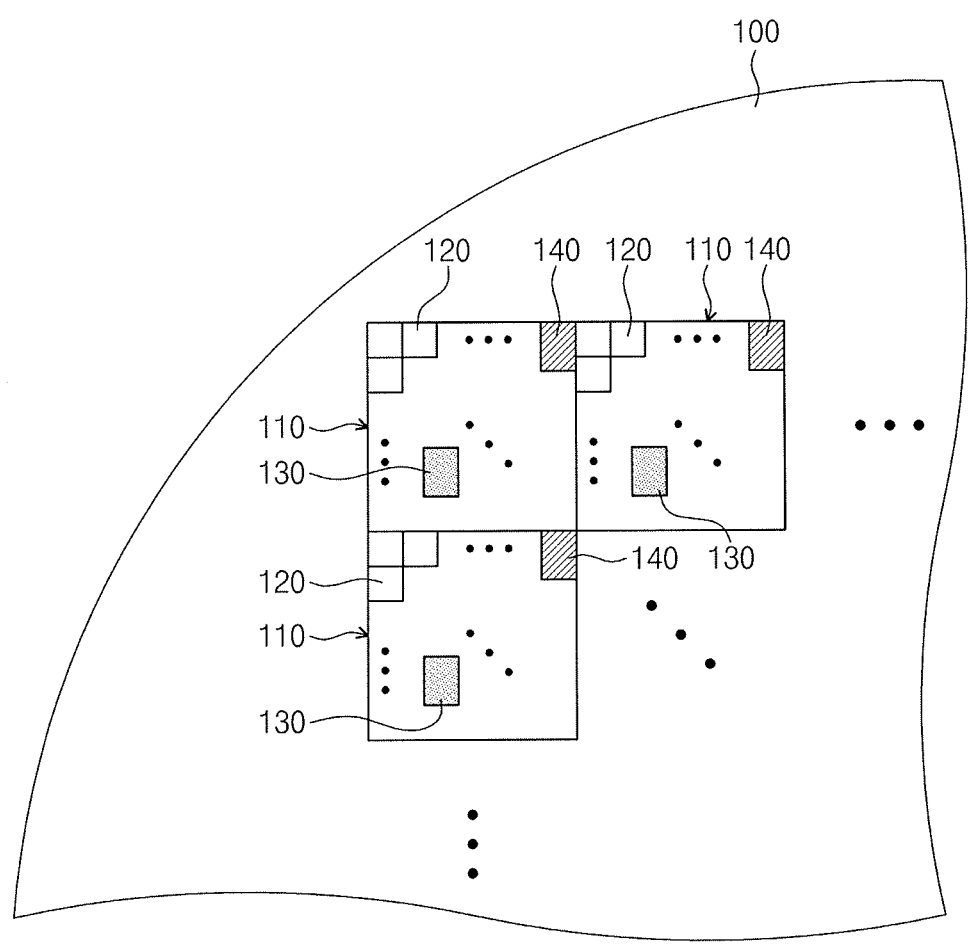
FIG. 2 is an enlarged view illustrating a portion of a semiconductor device, according to an exemplary embodiment of the inventive concept.

FIG. 1 is a cross-sectional view illustrating a semiconductor device, according to an exemplary embodiment of the inventive concept. FIG. 2 is an enlarged view illustrating a portion of a semiconductor device, according to an exemplary embodiment of the inventive concept.

Referring to FIGS. 1 and 2, a substrate 100 is formed of a semiconductor material. For example, the substrate 100 may be a silicon substrate, a germanium substrate, or a silicon-germanium substrate.

In FIG. 2, the substrate 100 includes a plurality of unit regions 110. Each of the plurality of unit regions 110 includes a plurality of main chips 120, a circuit test region 130, and a probe test region 140. Alternatively, at least one of the plurality of unit regions 110 may include only the probe test region 140.

In an exemplary embodiment, the plurality of unit regions 110 may have the same elements and the same shapes. A photolithography process may be performed during formation of the plurality of main chips 120, the circuit test region 130, and/or the probe test region 140. In an exemplary embodiment, each of the plurality of unit regions 110 may be a region to which light is simultaneously irradiated during an exposing process of the photolithography process. In an exemplary embodiment, one hundred unit regions 110 may be provided on the substrate 100, however, exemplary embodiments of the inventive concept are not limited thereto.

The plurality of main chips 120 may include a plurality of memory elements. The plurality of memory elements may be, for example, non-volatile memory elements or volatile memory elements. The plurality of main chips 120 may further include a plurality of transistors, a plurality of capacitors, and/or various other circuit elements.

Test circuits and circuit test pads connected to the test circuits may be disposed on the circuit test region 130 of the substrate 100. The test circuits and the test circuit pads will be described with reference to FIG. 3.

Figure 3:
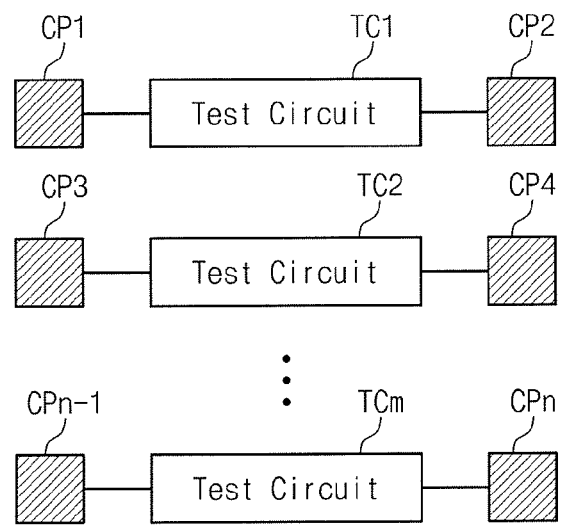
FIG. 3 is a view illustrating a circuit test region of a substrate included in a semiconductor device, according to an exemplary embodiment of the inventive concept.

FIG. 3 is a view illustrating a circuit test region of a substrate included in a semiconductor device, according to an exemplary embodiment of the inventive concept.

Referring to FIG. 3, first to n-th circuit test pads CP1 to CPn are disposed on the circuit test region 130 of the substrate 100, where n is a positive integer greater than or equal to 2. For example, in an exemplary embodiment, first to 24th test pads CP1 to CPn may be disposed on the circuit test region 130, however, exemplary embodiments of the inventive concept are not limited thereto. The plurality of circuit test pads CP1 to CPn may be connected to first to m-th test circuits TC1 to TCm, where m is a positive integer greater than or equal to 2.

The test circuits TC1 to TCm may include circuit elements different from each other, respectively. Alternatively, at least some of the test circuits TC1 to TCm may include the same circuit element(s). For example, at least some of the test circuits TC1 to TCm may include resistance patterns and/or capacitors.

In an exemplary embodiment, one test circuit may be connected to a pair of the circuit test pads. For example, the first test circuit TC1 may be connected to the first and second circuit test pads CP1 and CP2, and the second test circuit TC2 may be connected to the third and fourth circuit test pads CP3 and CP4. Alternatively, one test circuit may be connected to three or more circuit test pads.

Exemplary embodiments of the inventive concept are not limited to the arrangement of the test circuits TC1 to TCm and the circuit test pads CP1 to CPn illustrated in FIG. 3. For example, the test circuits TC1 to TCm and the circuit test pads CP1 to CPn may be arranged in various shapes. Further, the test circuits TC1 to TCm may be disposed at different levels from those of the circuit test pads CP1 to CPn with respect to a top surface of the substrate 100.

In an exemplary embodiment, the first to n-th circuit test pads CP1 to CPn and the first to m-th test circuits TC1 to TCm are insulated from the main chips 120.

Referring to FIGS. 1 and 2, probe test pads and resistance patterns connected to the probe test pads may be disposed on the probe test region 140 of the substrate 100.

A probe card 200 may be loaded over the substrate 100. The probe card 200 may include first to n-th probe pins PRB1 to PRBn. For example, the probe card 200 may include twenty-four probe pins, however, exemplary embodiments of the inventive concept are not limited thereto.

The probe pins PRB1 to PRBn of the probe card 200 may be in contact with the probe test pads, and may be used to test the probe card 200 for a failure. Examples of the probe test region 140 included in the semiconductor device according to exemplary embodiments of the inventive concept will be described with reference to FIGS. 4 to 6.

Figure 4:
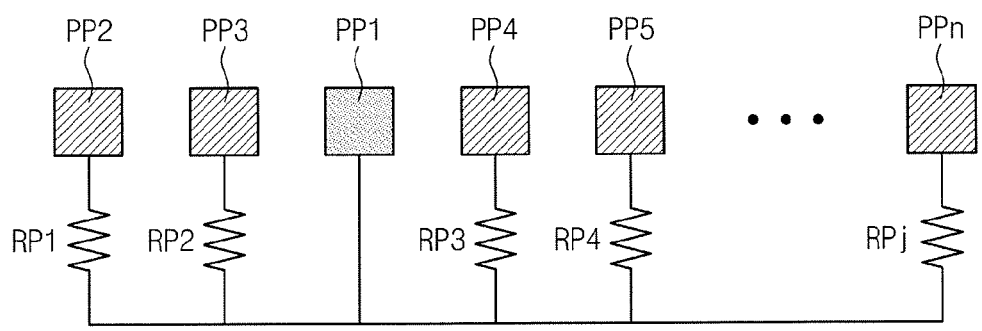
FIG. 4 is a view illustrating a probe test region of a substrate included in a semiconductor device, according to an exemplary embodiment of the inventive concept.

FIG. 4 is a view illustrating a probe test region of a substrate included in a semiconductor device, according to an exemplary embodiment of the inventive concept.

Referring to FIG. 4, first to n-th probe test pads PP1 to PPn, and first to j-th resistance patterns RP1 to RPj are disposed on the probe test region 140, where j=n−1. For example, in an exemplary embodiment, twenty-four probe test pads PP1 to PPn and twenty-three resistance patterns RP1 to RPn may be disposed on the probe test region 140, however, exemplary embodiments of the inventive concept are not limited thereto.

The first probe test pad PP1 may be a common pad which is connected to the other probe test pads PP2 to PPn through the resistance patterns RP1 to RPj. For example, the first resistance pattern RP1 may be connected to the first probe test pad PP1 and the second probe test pad PP2, the second resistance pattern RP2 may be connected to the first probe test pad PP1 and the third probe test pad PP3, and the j-th resistance pattern RPj may be connected to the first probe test pad PP1 and the n-th probe test pad PPn.

A resistance value between the first and second probe test pads PP1 and PP2 may be less than a resistance value between the second and third probe test pads PP2 and PP3. For example, the resistance value between the first and second test pads PP1 and PP2 may be the resistance value of the first resistance pattern RP1, and the resistance value between the second and third probe test pads PP2 and PP3 may be the sum of the resistance values of the first and second resistance patterns RP1 and RP2.

In an exemplary embodiment, the resistance patterns RP1 to RPj may have substantially the same resistance value. For example, in an exemplary embodiment, each of the resistance patterns RP1 to RPj may have a resistance value within a range of about 1 k$\Omega$ to about 20 k$\Omega$. Alternatively, the resistance values of the resistance patterns RP1 to RPj may be different from each other.

Exemplary embodiments of the inventive concept are not limited to the arrangement of the probe test pads PP1 to PPn and the resistance patterns RP1 to RPj illustrated in FIG. 4. The probe test pads PP1 to PPn and the resistance patterns RP1 to RPj may be arranged in various shapes. For example, an exemplary embodiment may include more than one common pad, as described with reference to FIG. 5.

Figure 5:
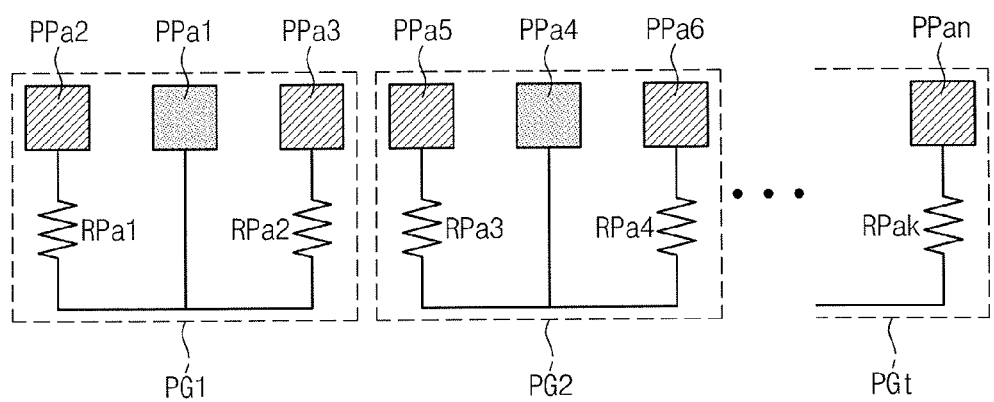
FIG. 5 is a view illustrating a probe test region of a substrate included in a semiconductor device, according to an exemplary embodiment of the inventive concept.

FIG. 5 is a view illustrating a probe test region of a substrate included in a semiconductor device, according to an exemplary embodiment of the inventive concept.

Referring to FIG. 5, first to t-th probe test groups PG1 to PGt are disposed on a probe test region 142, where t is a positive integer greater than or equal to 2. In an exemplary embodiment, the probe test region 142 in FIG. 5 may replace the probe test region 140 in the substrate 100 in FIG. 2. The probe test groups PG1 to PGt may include first to n-th probe test pads PPa1 to PPan, and first to k-th resistance patterns RPa1 to RPak connected to the first to n-th probe test pads PPa1 to PPan, where k is a positive integer greater than or equal to 2.

One probe test pad may be connected to the other probe test pads through a resistance pattern in at least one of the probe test groups PG1 to PGt.

For example, the first resistance pattern RPa1 may be connected to the first and second probe test pads PPa1 and PPa2, and the second resistance pattern RPa2 may be connected to the first and third probe test pads PPa1 and PPa3 in the first probe test group PG1. In this case, a resistance value of the first resistance pattern RPa1 between the first and second probe test pads PPa1 and PPa2 is less than the sum of resistance values of the first and second resistance patterns RP1 and RP2 between the second and third probe test pads PPa2 and PPa3. In the second probe test group PG2, the third resistance pattern RPa3 may be connected to the fourth and fifth probe test pads PPa4 and PPa5, and the fourth resistance pattern RPa4 may be connected to the fourth and sixth probe test pads PPa4 and PPa6.

In an exemplary embodiment, the probe test pads included in one probe test group are insulated from the probe test pads included in another probe test group. For example, the first to third probe test pads PPa1 to PPa3 in the first probe test group PG1 in FIG. 5 may be insulated from the fourth to sixth probe test pads PPa4 to PPa6 in the second probe test group PG2.

The exemplary embodiments described above include first and second probe test groups PG1 and PG2 each having three probe test pads, however, exemplary embodiments of the inventive concept are not limited thereto. For example, in an exemplary embodiment, each of the probe test groups PG1 to PGt may have four or more probe test pads. Additionally, as illustrated in FIG. 5, the number of probe test pads and resistance patterns of the first probe test group PG1 may be the same as the number of probe test pads and resistance patterns of the second probe test group PG2. However, exemplary embodiments of the inventive concept are not limited thereto. For example, in an exemplary embodiment, the number of probe test pads and resistance patterns of one of the probe test groups PG1 to PGt may be different from the number of probe test pads and resistance patterns of another one of the probe test groups PG1 to PGt.

Figure 6:
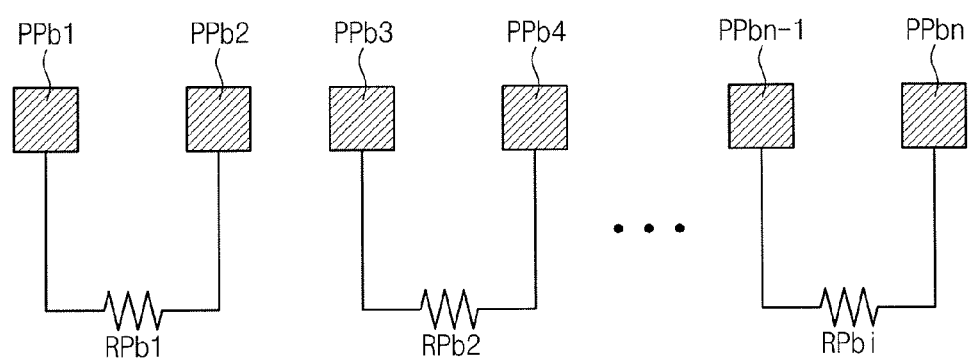
FIG. 6 is a view illustrating a probe test region of a substrate included in a semiconductor device, according to an exemplary embodiment of the inventive concept.

FIG. 6 is a view illustrating a probe test region of a substrate included in a semiconductor device, according to an exemplary embodiment of the inventive concept.

Referring to FIG. 6, first to n-th probe test pads PPb1 to PPbn and first to i-th resistance pattern RPb1 to RPbi connected to the first to n-th probe test pads PPb1 to PPbn are disposed in a probe test region 144, where i is a positive integer greater than or equal to 2. In an exemplary embodiment, the probe test region 144 in FIG. 6 may replace the probe test region 140 in the substrate 100 in FIG. 2.

In FIG. 6, each of the resistance patterns RPb1 to RPbi are connected to a pair of the probe test pads. For example, the first resistance pattern RPb1 may be connected to the first and second probe test pads PPb1 and PPb2, the second resistance pattern RPb2 may be connected to the third and fourth probe test pads PPb3 and PPb4, and the i-th resistance pattern RPbi may be connected to the n−1th and n-th probe test pads PPn−1 and PPn.

In an exemplary embodiment, the probe test pads are respectively connected to different resistance patterns and are insulated from each other. For example, the first and second probe test pads PPb1 and PPb2 connected to the first resistance pattern RPb1 may be insulated from the third and fourth probe test pads PPb3 and PPb4 connected to the second resistance pattern RPb2. Since the second and third probe test pads PPb2 and PPb3 are insulated from each other, a resistance value between the first and second probe test pads PPb1 and PPb2 is less than a resistance value between the second and third probe test pads PPb2 and PPb3.

According to exemplary embodiments of the inventive concept, before the test circuits TC1 to TCm of the circuit test region 130 of FIG. 3 are tested, the probe pins PRB1 to PRBn of the probe card 200 of FIG. 1 may be put into contact with the probe test pads described with reference to FIGS. 4 to 6, and the probe card 200 may be tested for a fault(s) and/or failure. A method of testing a semiconductor device according to an exemplary embodiment will be described with reference to FIG. 7.

Figure 7:
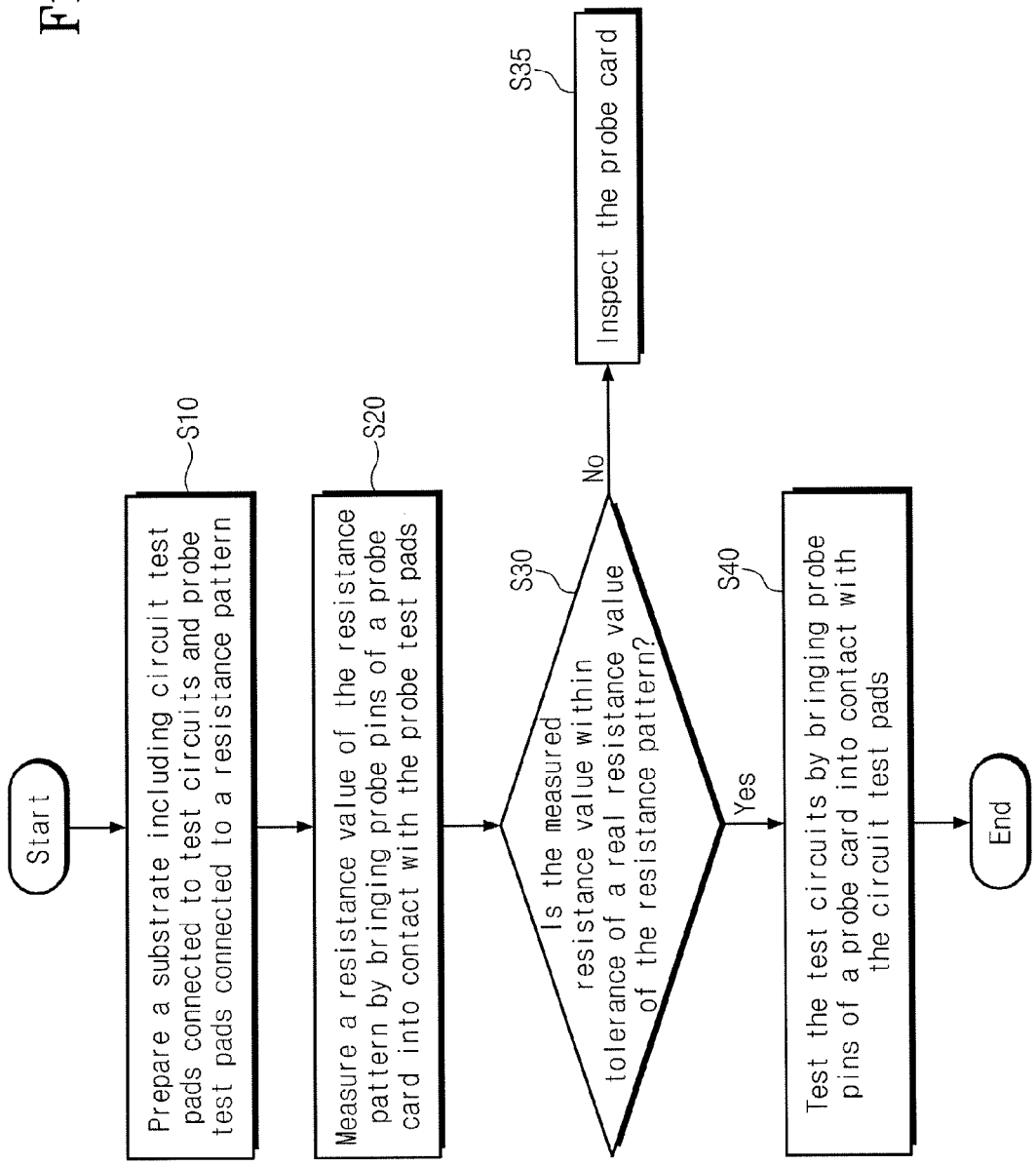
FIG. 7 is a flow chart illustrating a method of testing semiconductor devices, according to an exemplary embodiment of the inventive concept.

FIG. 7 is a flow chart illustrating a method of testing semiconductor devices, according to an exemplary embodiment of the inventive concept.

Referring to FIG. 7, the substrate 100 including the main chips 120, the circuit test region 130, and the probe test region 140 illustrated in FIG. 2 may be prepared at block S10. The test circuits TC1 to TCm and the circuit test pads CP1 to CPn connected to the test circuits TC1 to TCm described with reference to FIG. 3 may be disposed in the circuit test region 130. The probe test pads and the resistance patterns described with reference to FIG. 4, 5, or 6 may be disposed in the probe test region 140.

At block S20, the probe pins PRB1 to PRBn of the probe card 200 described with reference to FIG. 1 may be put into contact with the probe test pads to measure resistance values of the resistance patterns. A method of measuring the resistance values of the resistance patterns in the probe test region in the semiconductor device according to exemplary embodiments will be described with reference to FIGS. 8 to 10.

Figure 8:
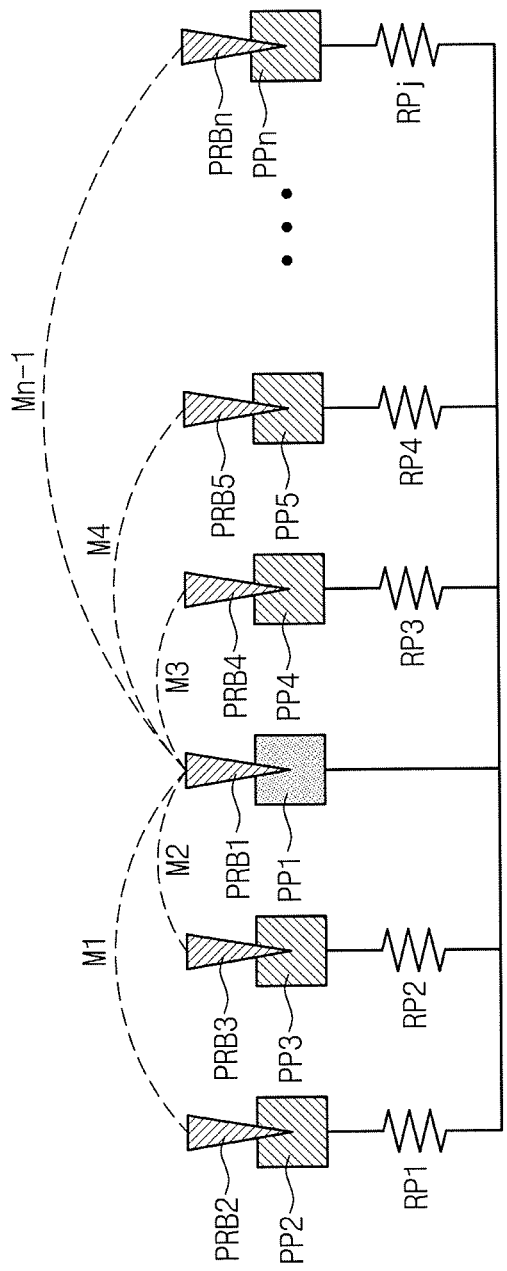
FIG. 8 is a view illustrating a method of measuring resistance values of resistance patterns in the probe test region of FIG. 4, according to an exemplary embodiment of the inventive concept.

FIG. 8 is a view illustrating a method of measuring resistance values of resistance patterns in the probe test region of FIG. 4, according to an exemplary embodiment.

Referring to FIG. 8, the first to n-th probe test pads PP1 to PPn and the first to j-th resistance patterns RP1 to RPj of FIG. 4 are provided. The first to n-th probe pins PRB1 to PRBn of FIG. 1 may be put into contact with the first to n-th probe test pads PP1 to PPn, respectively.

In FIG. 8, resistance values of the first to j-th resistance patterns RP1 to RPj are sequentially measured. For example, a resistance value of the first resistance pattern RP1 between the first and second probe test pads PP1 and PP2 may be measured using the first and second probe pins PRB1 and PRB2 (M1). The third to n-th probe pins PRB3 to PRBn may be disconnected from their respective probe test pads during measurement of the resistance value of the first resistance pattern RP1. After the resistance value of the first resistance pattern RP1 is measured, a resistance value of the second resistance pattern RP2 may be measured using the first and third probe pins PRB1 and PRB3 (M2). The second and fourth to n-th probe pins PRB2 and PRB4 to PRBn may be disconnected from their respective probe test pads during measurement of the resistance value of the second resistance pattern RP2. After the resistance value of the second resistance pattern RP2 is measured, a resistance value of the third resistance pattern RP3 may be measured using the first and fourth probe pins PRB1 and PRB4 (M3). Subsequently, a resistance value of the fourth resistance pattern RP4 may be measured in a similar manner using the first and fifth probe pins PRB1 and PRB5 (M4). Similarly, a resistance value of the j-th resistance pattern RPj may be measured using the first and n-th probe pins PRB1 and PRBn (Mn−1).

Figure 9:
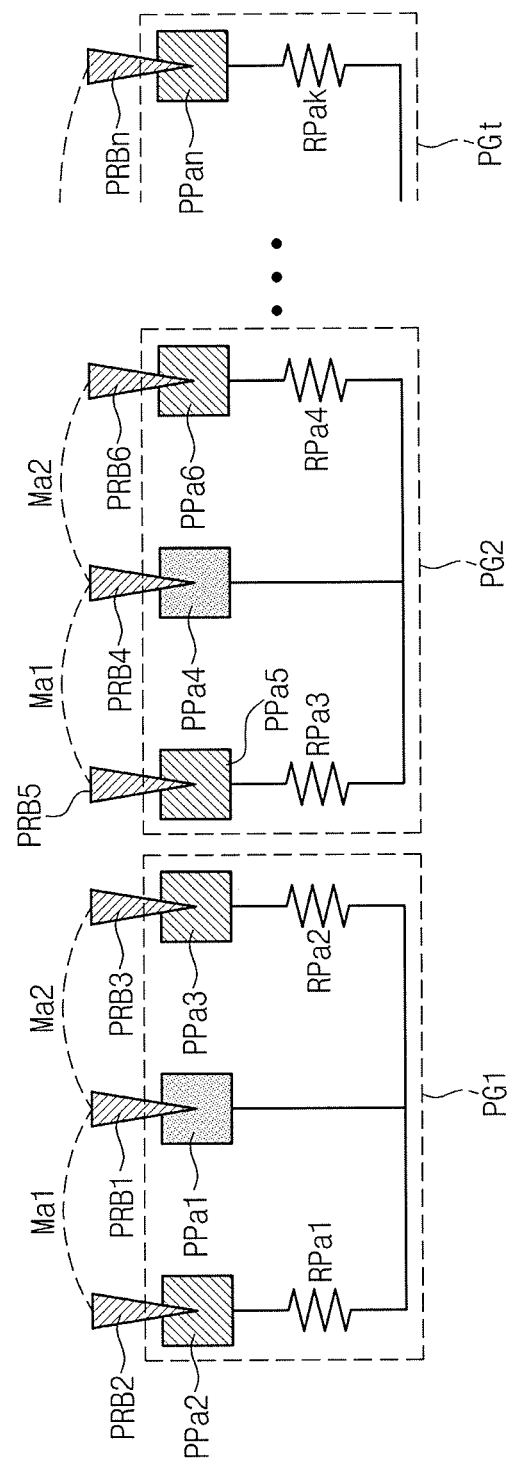
FIG. 9 is a view illustrating a method of measuring resistance values of resistance patterns in the probe test region of FIG. 5, according to an exemplary embodiment of the inventive concept.

FIG. 9 is a view illustrating a method of measuring resistance values of resistance patterns in the probe test region of FIG. 5, according to an exemplary embodiment.

Referring to FIG. 9, the probe test groups PG1 to PGt including the first to n-th probe test pads PPa1 to PPan and the first to k-th resistance patterns RPa1 to RPak of FIG. 5 are provided. The first to n-th probe pins PRB1 to PRBn of FIG. 1 may be put into contact with the first to n-th probe test pads PPa1 to PPan, respectively.

Resistance values of the resistance patterns in the same probe test group may be sequentially measured, and resistance values of the resistance patterns included in the different probe test groups may be measured simultaneously.

For example, resistance values of the first resistance pattern RPa1 and the third resistance pattern RPa3 may be simultaneously measured using the first and second probe pins PRB1 and PRB2 and the fourth and fifth probe pins PRB4 and PRB5 (Ma1). In this case, the third and sixth probe pins PRB3 and PRB6 may be disconnected from their respective probe test pads. After the resistance values of the first and third resistance patterns RPa1 and RPa3 are measured, resistance values of the second resistance pattern RPa2 and the fourth resistance pattern RPa4 may be simultaneously measured using the first and third probe pins PRB1 and PRB3 and the fourth and sixth probe pins PRB4 and PRB6 (Ma2). In this case, the second and fifth probe pins PRB2 and PRB5 may be disconnected from their respective probe test pads.

Alternatively, after the resistance values of the first and second resistance patterns RPa1 and RPa2 in the first probe test group PG1 are measured, the resistance values of the third and fourth resistance patterns RPa3 and RPa4 in the second probe test group PG2 may be measured.

Figure 10:
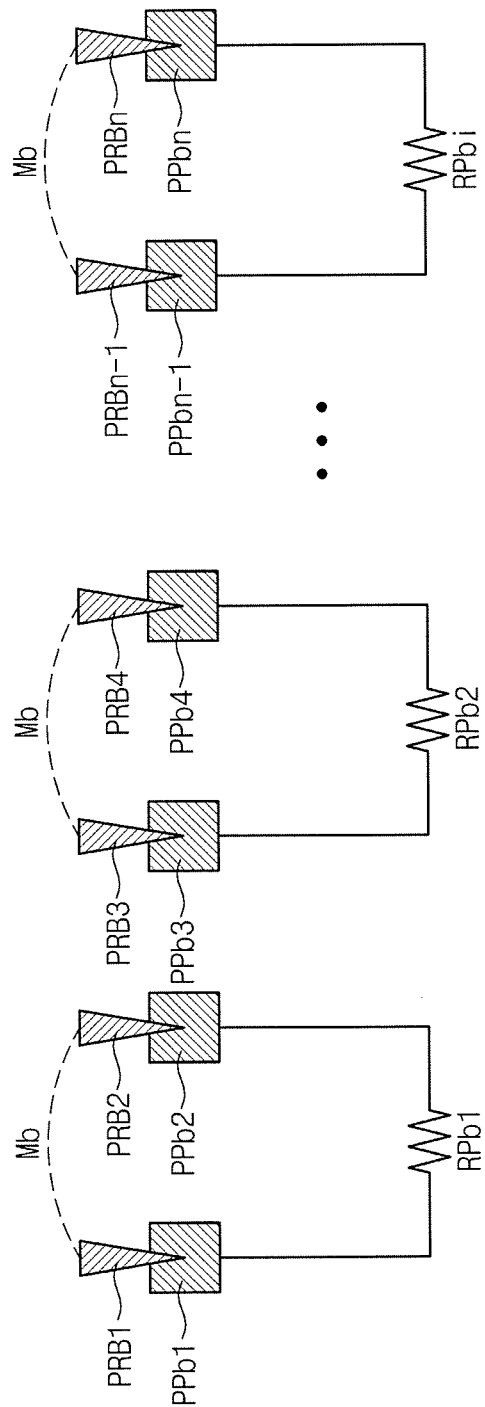
FIG. 10 is a view illustrating a method of measuring resistance values of resistance patterns in the probe test region of FIG. 6, according to an exemplary embodiment of the inventive concept.

FIG. 10 is a view illustrating a method of measuring resistance values of resistance patterns in the probe test region of FIG. 6, according to an exemplary embodiment.

Referring to FIG. 10, the first to n-th probe test pads PPb1 to PPbn and the first to i-th resistance patterns RPb1 to RPbi of FIG. 6 are provided. The first to n-th probe pins PRB1 to PRBn of FIG. 1 may be in contact with the first to n-th probe test pads PPb1 to PPbn, respectively.

Each of the first to i-th resistance patterns RPb1 to RPbi may be connected to a pair of the probe test pads. Resistance values of the first to i-th resistance patterns RPb1 to RPbi may be measured simultaneously (Mb).

Alternatively, the resistance values of the first to i-th resistance patterns RPb1 to RPbi may be sequentially measured.

Referring to FIG. 7, at block S30, the measured resistance values, which may be obtained using the methods described with reference to FIGS. 8 to 10, are compared with real resistance values of the resistance patterns, and it is verified whether the measured resistance values are within tolerances of the real resistance values.

If the measured resistance values are not within the tolerances of the real resistance values, a failure and/or fault(s) of the probe card 200 of FIG. 1 may be detected, and the probe card 200 is inspected at block S35.

If the measured resistance values are within the tolerances of the real resistance values, the probe pins PRB1 to PRBn of the probe card 200 of FIG. 1 may be put into contact with the circuit test pads CP1 to CPn of FIG. 3 to test the test circuits TC1 to TCm at block S40. As described with reference to FIG. 2, when the substrate 100 includes the plurality of the unit regions 110 and each of the unit regions 110 includes the circuit test region 130, the test circuits in the circuit test regions 130 of some of the unit regions 110 may be tested. For example, in an exemplary embodiment, when one hundred unit regions 110 are provided, the test circuits in thirteen unit regions 110 may be tested. However, exemplary embodiments of the inventive concept are not limited thereto.

In the method of testing a semiconductor device according to exemplary embodiments of the inventive concept, before the test circuits are tested, the probe card 200 may be tested for failure and/or fault(s). Thus, a test having high reliability may be performed on the test circuits.

For example, if the probe card is not tested and the results of testing the test circuits show failure, the failure may be the result of faults with either the test circuits or the probe card.

However, if the probe card 200 is tested through the probe test region 130 before testing the test circuits of the substrate having the circuit and probe test regions 130 and 140, a test having high reliability may be performed on the test circuits.

In an exemplary embodiment, a test of the probe card may be performed prior to testing the test circuits of each of the plurality of substrates including the circuit test region and the probe test region, as described with reference to FIG. 11.

Figure 11:
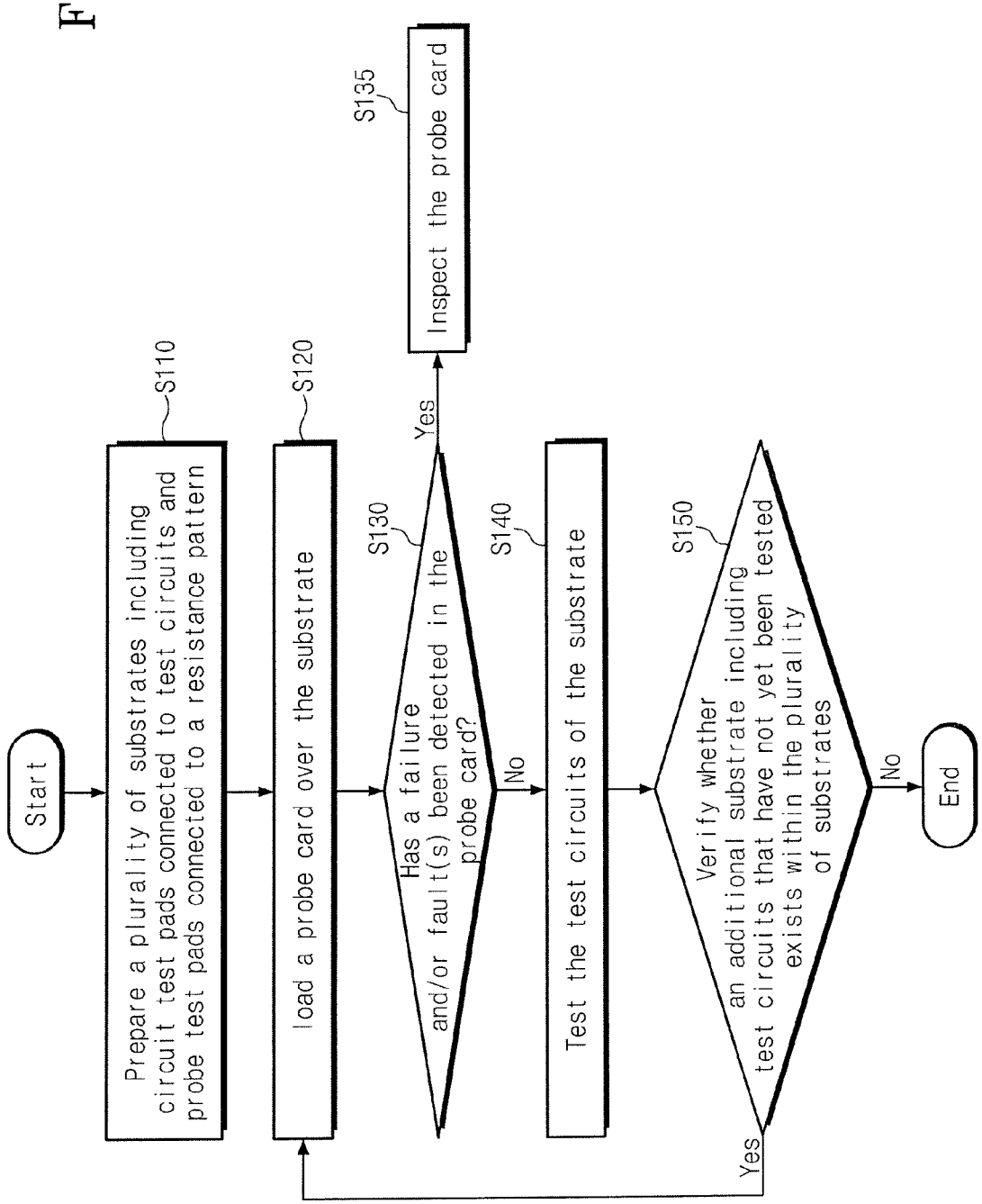
FIG. 11 is a flow chart illustrating a method of testing semiconductor devices, according to an exemplary embodiment of the inventive concept.

FIG. 11 is a flow chart illustrating a method of testing semiconductor devices, according to an exemplary embodiment of the inventive concept.

Referring to FIG. 11, a plurality of substrates may be prepared at block S110. As described with reference to block S10 of FIG. 7, each of the substrates may include circuit test pads connected to the test circuits and probe test pads connected to the resistance patterns.

The probe card 200 may be loaded over one of the substrates at block S120.

As described with reference to blocks S20 and S30 of FIG. 7, at block S130, the probe pins of the probe card 200 may be put into contact with the probe test pads of the probe test region of the substrate, and the probe card may be tested for failure and/or fault(s).

If a failure and/or fault(s) is detected in the probe card, the probe card may be inspected at block S135.

If a failure and/or fault(s) is not detected in the probe card, the probe pins of the probe card may be put into contact with the circuit test pads of the circuit test region of the substrate, and the test circuits may be tested at block S140.

At block S150, it may be verified whether an additional substrate including test circuits that have not yet been tested exists within the plurality of substrates. If an additional untested substrate exists, the probe card may be loaded over the additional substrate at block S120. If an additional substrate does not exist, the test is completed.

Alternatively, after the probe card has been tested using one of the plurality of substrates including the circuit test regions and the probe test regions, the test circuits of the plurality of substrates may be tested, as described with reference to FIG. 12.

FIG. 12 is a flow chart illustrating a method of testing semiconductor devices, according to an exemplary embodiment of the inventive concept.

Referring to FIG. 12, blocks S110 to S140 described with reference to FIG. 11 are performed.

At block S160, it may be verified whether an additional substrate including test circuits that have not yet been tested exists within the plurality of substrates. If an additional substrate does not exist, the test is completed.

If an additional untested substrate exists, the probe card may be loaded over the additional substrate at block S165. After the probe card is loaded over the additional substrate, the probe pins of the probe card may be put into contact with the circuit test pads of the circuit test region of the additional substrate, and the test circuits may be tested at block S140.

According to exemplary embodiments of the inventive concept, the semiconductor device may include a plurality of main chips, circuit test pads connected to a test circuit, and resistance patterns connected to probe test pads. Before the test circuit is tested, probe pins of a probe card may be put into contact with probe test pads, and the probe card may be tested. Thus, a semiconductor device having a high reliability, and a method of testing the same may be provided.

While the present inventive concept has been particularly shown and described with reference to the exemplary embodiments thereof, it will be understood by those of ordinary skill in the art that various changes in form and detail may be made without departing from the spirit and scope of the inventive concept as defined by the following claims.

What is claimed is:

1. A semiconductor device, comprising:
a unit region comprising a circuit test region and a probe test region;
a test circuit and a plurality of circuit test pads disposed in the circuit test region, wherein the circuit test pads are operatively coupled to the test circuit; and
a first probe test pad, a second probe test pad, and a first resistance pattern disposed in the probe test region, wherein the first and second probe test pads are insulated from the circuit test pads, and the first resistance pattern is operatively coupled to the first and second probe test pads.

2. The semiconductor device of claim 1, further comprising:
a third probe test pad disposed in the probe test region and insulated from the circuit test pads,
wherein a resistance value between the second and third probe test pads is greater than a resistance value of the first resistance pattern.

3. The semiconductor device of claim 2, further comprising:
a second resistance pattern operatively coupled to the first and third probe test pads, wherein a resistance value of the second resistance pattern and the resistance value of the first resistance pattern are substantially equal to each other.

4. The semiconductor device of claim 3, further comprising:
a fourth probe test pad, a fifth probe test pad, and a sixth probe test pad disposed in the probe test region and insulated from the circuit test pads;

a third resistance pattern disposed in the probe test region and operatively coupled to the fourth and fifth probe test pads; and a fourth resistance pattern disposed in the probe test region and operatively coupled to the fourth and sixth probe test pads.

5. The semiconductor device of claim 4, wherein the fourth, fifth and sixth probe test pads are insulated from the first, second and third probe test pads.

6. The semiconductor device of claim 4, wherein the resistance value of the first resistance pattern, the resistance value of the second resistance pattern, a resistance value of the third resistance pattern, and a resistance value of the fourth resistance pattern are substantially equal to each other.

7. The semiconductor device of claim 1, further comprising:

a third probe test pad and a fourth probe test pad disposed in the probe test region, and insulated from the circuit test pads and the first and second probe test pads; and a second resistance pattern disposed in the probe test region and operatively coupled to the third and fourth probe test pads.

8. The semiconductor device of claim 7, wherein a resistance value of the first resistance pattern and a resistance value of the second resistance pattern are substantially equal to each other.

9. The semiconductor device of claim 1, further comprising:

third to n-th probe test pads disposed in the probe test region, wherein the first to n-th probe test pads are configured to make contact with first to n-th probe pins of a probe card, and n is a positive integer greater than or equal to 4.

10. The semiconductor device of claim 9, wherein the circuit test pads comprise first to n-th circuit test pads, and the first to n-th circuit test pads are configured to make contact with the first to n-th probe pins.

* * * * *